United States Patent
Laville et al.

(10) Patent No.: US 7,589,577 B2
(45) Date of Patent: Sep. 15, 2009

(54) CIRCUIT ADJUSTABLE AFTER PACKAGING HAVING A VOLTAGE LIMITER AND METHOD OF ADJUSTING SAME

(75) Inventors: Sébastien Laville, Grenoble (FR); Frédéric Goutti, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 63 days.

(21) Appl. No.: 11/302,945

(22) Filed: Dec. 13, 2005

(65) Prior Publication Data
US 2006/0132992 A1   Jun. 22, 2006

(30) Foreign Application Priority Data
Dec. 17, 2004   (FR) ................................. 04 13464

(51) Int. Cl.
*H03L 5/00* (2006.01)
(52) U.S. Cl. .................. 327/313; 327/525; 361/56
(58) Field of Classification Search ......... 327/309–333, 327/525, 526; 361/56, 225.7
See application file for complete search history.

(56) References Cited

U.S. PATENT DOCUMENTS

| | | | |
|---|---|---|---|
| 4,469,082 A | * | 9/1984 | Nishitoba et al. ........... 123/609 |
| 6,091,273 A | * | 7/2000 | Bernstein et al. ............ 327/321 |
| 6,410,398 B1 | | 6/2002 | Forel et al. |
| 6,437,959 B1 | | 8/2002 | Andrieu et al. |
| 2002/0079944 A1 | * | 6/2002 | Sander ....................... 327/309 |
| 2003/0076638 A1 | * | 4/2003 | Simonelli et al. ............. 361/56 |

OTHER PUBLICATIONS

French Search Report EP 0413464; May 2, 2005.

* cited by examiner

*Primary Examiner*—Lincoln Donovan
*Assistant Examiner*—Diana J Cheng
(74) *Attorney, Agent, or Firm*—Hogan & Hartson LLP

(57) ABSTRACT

A circuit adjustable after packaging includes a functional circuit supplied with a power potential and a reference potential and has at least one parameter adjustable by programming at least one programmable element and a circuit to program the programmable element of the functional circuit. The adjustable circuit also includes a limiter circuit to limit the voltage between the power supply potential and the reference potential to an adjustable limiting voltage, and a circuit to adjust the limiting voltage. After adjusting a parameter of the functional circuit, the limiting voltage of the limiter circuit is adjusted.

1 Claim, 1 Drawing Sheet

US 7,589,577 B2

CIRCUIT ADJUSTABLE AFTER PACKAGING HAVING A VOLTAGE LIMITER AND METHOD OF ADJUSTING SAME

RELATED APPLICATION

The present application claims priority of French Patent Application No. 0413464 filed Dec. 17, 2004, which is incorporated herein in its entirety by this reference.

FIELD OF THE INVENTION

The invention relates to an integrated circuit adjustable after packaging. Such a circuit includes a functional circuit supplied with a power potential and a reference potential, and has at least one parameter adjustable by the programming of at least one programmable element and a circuit to program the programmable element of the functional circuit.

BACKGROUND OF THE INVENTION

The functional circuits considered here are, for example, amplifiers, voltage or current sources, etc., for which it is possible to adjust, for example, an input resistance or an output reference potential through the programming of programmable elements provided for this purpose. These elements are, for example, one-time programmable fuses or antifuses. The adjusting of the parameter or parameters is done after packaging of the functional circuit in a plastic pack, through the application of appropriate control signals to the standard pins of the packaged circuits. The programming of one or more programmable elements thus makes it possible to compensate for any drift in the parameter considered that may have appeared during the packaging of the circuit and thus enables high precision to be obtained for the parameter, i.e. precision at least as high as that obtained after adjustment during the silicon wafer sorting process. One exemplary embodiment of an adjustment device intended for this purpose is described in the patent application FR2795557.

A programming circuit is therefore used to adjust a parameter of the functional circuit by programming a fuse (or antifuse) of the functional circuit. This programming typically includes the application of a high voltage to the terminals of the fuse, at a level sufficient to disrupt or blow the fuse, i.e. to make it change its state.

The drawback of using such a programming circuit is that, due to the high potential used, the integrated circuit no longer meets the relatively stringent standards laid down for the protection of individuals, especially their protection from electrostatic discharge. These standards impose a borderline value on the potentials that appear in an integrated circuit, this value being lower than the potential needed to program adjustment fuses.

What is desired is an adjustable circuit that can resolve this problem.

SUMMARY OF THE INVENTION

According to an embodiment of the present invention, an integrated circuit includes, in addition to a programming circuit to adjust a parameter of a functional circuit, a limiter circuit to limit the voltage between the power supply potential and the reference potential to an adjustable limiting voltage, and a circuit to adjust the limiting voltage.

The circuit according to the present invention is used in accordance with a method of the invention which includes a first step in which at least one programmable element of the integrated circuit is programmed to adjust at least one parameter of the functional circuit, and also includes a second step in which the limiting voltage of the limiter circuit is adjusted.

Initially, the limiting voltage of the limiter circuit is at a first level, preferably high enough to program the programmable element of the integrated circuit in the first step. Then, in the second step, the limiting voltage itself is adjusted to a second level chosen, for example, as a function of criteria such as compliance with standards on the protection of individuals.

Thus, the adjustable circuit meets the safety standards applicable in normal operation, as soon as the adjustment phase is completed.

In one embodiment of the invention, the limiter circuit includes a programmable element whose programming is used to adjust the limiting voltage. The adjusting of the limiting voltage is thus done simply, in a manner fairly similar to the adjusting of the adjustable parameters of the functional circuit.

In one example, the adjustment circuit includes a means to reduce the limiting voltage, and the reduction of the limiting voltage leads to the inhibition of the adjustment circuit.

BRIEF DESCRIPTION OF THE DRAWINGS

The invention will be understood more clearly and other features and advantages will appear from the following description of an exemplary implementation of an adjustable circuit of the invention and a method for the adjustment of such a circuit. The description must be read with reference to the appended drawings, of which.

DETAILED DESCRIPTION

Figure 1:
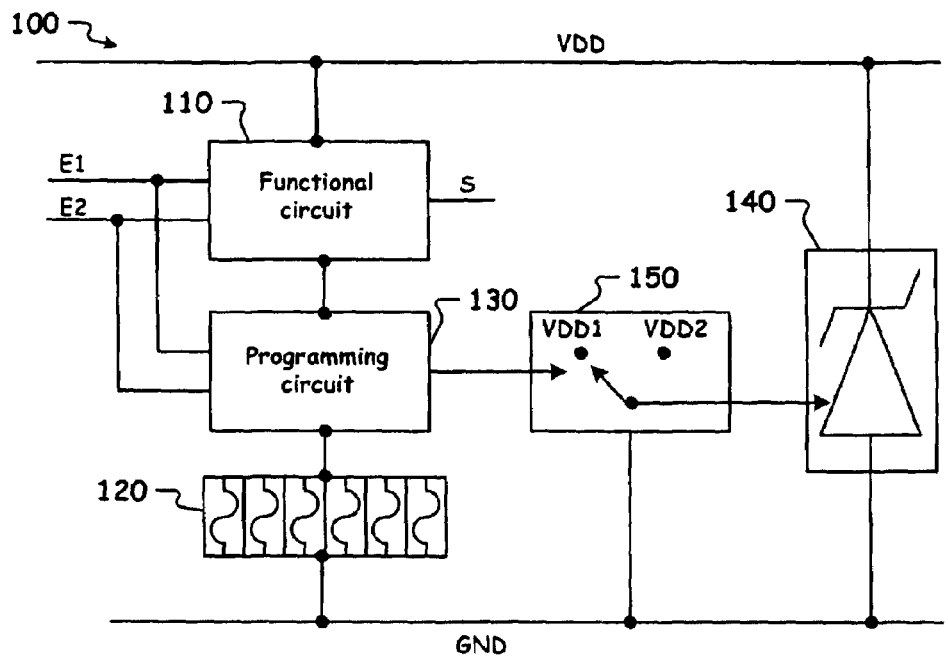
FIG. 1 is a schematic drawing of a programmable circuit according to the invention.

Referring now to FIG. 1, an exemplary programmable circuit according to the invention includes a functional circuit 110, at least one programmable element 120 (six elements are shown in FIG. 1) and a programming circuit 130. In addition, the circuit of the invention includes a limiter circuit 140 and an adjusting means 150. The programmable circuit 100 is packaged in a plastic pack.

The circuit 100 is powered between a power supply potential VDD and a reference potential GND; it receives control signals and/or data signals at two inputs E1, E2 and produces control signals and/or data signals at one output S. Here, the inputs E1, E2 and the output S are the only terminals of the circuit accessible from the outside of the plastic pack.

In one example, the functional circuit 110 is a voltage amplifier whose amplification coefficient can be adjusted by the programming of one of the elements 120.

Here, the programmable element or elements 120 are antifuses: depending on whether the element is programmed or not, they are equivalent to a short-circuit or to an open circuit.

The programming circuit 130 is used to program the elements 120 as a function of control signals applied to the inputs E1, E2. The programming circuit 130 is made, for example, according to the teaching of the document FR2795557.

The limiter circuit 140 has the function of limiting the potential difference between VDD and GND to an adjustable predefined limiting voltage. The circuit 150 has the function of adjusting the value of the limiting voltage of the circuit 140, either to a first value VDD1 or to a second value VDD2 lower than VDD1. As an example, VDD1 is chosen to be higher than or equal to a potential for the programming of the elements 120, and VDD2 is chosen so as to meet the standards on the protection of individuals.

In one example, the values VDD1=12 V, VDD2=6 V are chosen for a circuit using antifuses programmable by the application of a potential of the order of 9 V and working normally, after adjustment, with a power supply potential VDD of the order of 5 V.

The following is the general working of the circuit of FIG. 1. Initially, before any standard use of the circuit 100, the limiting voltage of the circuit 140 is equal to VDD1.

In a first step, appropriate control signals are applied to the inputs E1, E2 and a sufficiently high potential VDD (higher than VDD2 and lower than VDD1) is applied to program the appropriate element of the circuit 120 so as to thus adjust the amplifier coefficient of the circuit 110.

In a second step, appropriate control signals are applied to the inputs E1, E2 and a sufficiently high potential VDD (in practice a potential higher than VDD2 and lower than VDD1) is applied so that the circuit 150 adjusts the limiting voltage to a value VDD2.

The circuit 100 thus programmed is then ready for use in the context of normal operation. It furthermore meets the safety standards on the protection of individuals inasmuch as its internal potentials are now limited to the value VDD2 by the limiter circuit 140.

It will also be noted that, after adjustment of the limiting voltage to the value VDD2, the circuit 100 is no longer modifiable: it is no longer possible for any programmable element to be programmed (VDD2 being lower than the potential needed for the programming of an antifuse or fuse) and the working of the programming circuit 130 is inhibited inasmuch and it is no longer possible to apply, to a programmable element, potentials high enough to program it.

Figure 2:
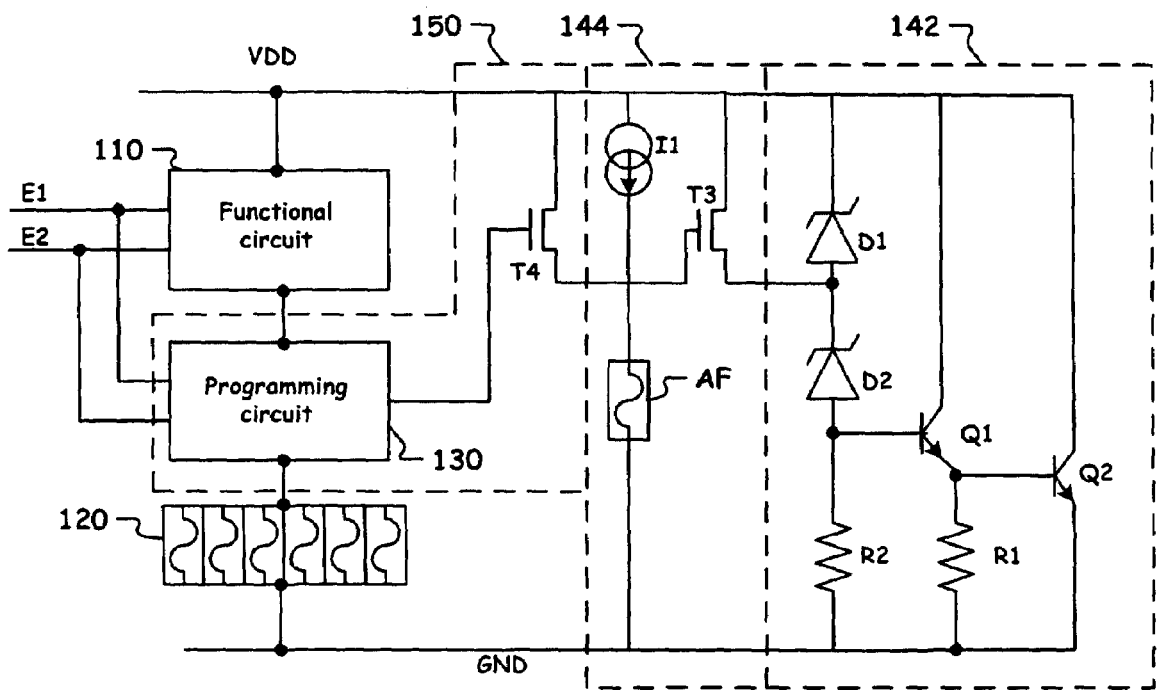
FIG. 2 is a detailed electronic drawing of a circuit according to the invention.

FIG. 2 provides a detailed view of an embodiment of the limiter circuit 140 and of the adjustment circuit 150 of the circuit 100 of FIG. 1.

The limiter circuit includes a circuit 142, equivalent to two stable potential sources, respectively producing a potential VDD0 and the potential VDD2 (with VDD1=VDD2+VDD0), and series-connected between a terminal to which the power supply potential VDD is applied and a terminal (or ground) to which the reference potential GND is applied.

The circuit 142 has two diodes D1, D2 which, in the example, are Zener type diodes, two resistors R1, R2 and two bipolar type transistors Q1, Q2. The cathode of the diodes D2 is coupled to the anode of the diode D1 whose cathode is coupled to the power supply terminal VDD, and the anode of the diode D2 is coupled to a terminal of the resistor R2 whose other terminal is coupled to the reference potential. The transistor Q1 has a base coupled to the common point of the diode D2 and of the resistor R2, a collector coupled to the power supply terminal and an emitter coupled to a terminal of R1 whose other terminal is ground-connected. Finally, the transistor Q2 has a base coupled to the emitter of Q1, a collector coupled to the power supply terminal and an emitter that is coupled to the reference potential. The diagram of the circuit 142 is a classic diagram of a band-gap type stable potential source initially producing a potential VDD1 proportional to the voltage drop in the diodes D1, D2.

The circuit 144 is equivalent to a one-time programmable switch, which is parallel-connected to the diode D1. The circuit 144 is equivalent to an open circuit before programming and to a short-circuit after programming.

The circuit 144 has a current source I1, a PMOS transistor T3, a non-inverter buffer BU and a programmable antifuse AF. The drain-source channel of T3 is parallel-connected to the diode D1, the current source is coupled between the drain and the gate of the transistor T3 and the antifuse is coupled between the gate of T3 and ground.

Before the antifuse AF is programmed, the source produces a current I1 that takes the potential and the gate of T3 to the level VDD: T3 is off and does not modify the behavior of the diode D1. In this case, the circuit 142 is equivalent to a source producing the potential VDD1.

After it has been programmed, the antifuse AF, which is equivalent to a short-circuit, draws the potential at the gate of T3 to the value GND: T3 is on and short-circuits the diode D1. The circuit 142 is in this case equivalent to a source producing the potential VDD2.

The adjusting circuit 150 enables the programming of the antifuse AF of the adjustment circuit 140. In the example of FIG. 2, the circuit 150 includes the programming circuit 130 as well as a selection transistor T4. This selection transistor T4 comprises a drain-source channel coupled between the power supply terminal to which VDD is applied and a terminal of the antifuse AF to be programmed, and a control gate coupled to an output of a programming circuit.

In the example of FIG. 2, the same control circuit 130 is used to program the antifuse of the adjustment circuit 144 of the limiter circuit 140, and to program the programmable elements 120 of the functional circuit 110. Depending on an appropriate command at the inputs E1, E2, the circuit 130 outputs an appropriate signal to turn the transistor T4 on.

While there have been described above the principles of the present invention in conjunction with specific memory architectures and methods of operation, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicant hereby reserves the right to formulate new claims to such features and/or combinations of such features during the prosecution of the present application or of any further application derived therefrom.

What is claimed is:

1. A circuit adjustable after packaging, comprising:
a functional circuit supplied with a power potential and a reference potential and comprising at least one parameter adjustable by the programming of at least one programmable element;
a programming control circuit to program the programmable element of the functional circuit;
a limiter circuit to limit the voltage between the power supply potential and the reference potential to an adjustable limiting voltage, and
a circuit to adjust the limiting voltage,
wherein the limiter circuit comprises:
a first generator producing a first stable potential and a second generator producing a second potential, series-connected between a power supply terminal to which the power supply potential is applied and a reference terminal to which the reference potential is applied; and a programmable switch that is parallel-connected between the terminals of the first stable generator and closed or open as a function of a programmed or non-programmed state, and wherein the first generator and the second generator together comprise:

a first resistor having one terminal coupled to the reference terminal of the circuit and the other terminal coupled to an emitter of a first bipolar transistor having one collector coupled to the power supply terminal;

a second resistor having one terminal coupled to a base of the first bipolar transistor and another terminal coupled to the reference terminal;

a second bipolar transistor having a base coupled to the emitter of the first transistor, a collector coupled to the power supply terminal and an emitter coupled to the reference terminal; and a first diode and a second diode series-connected between the power supply terminal and the base of the first transistor, the programmable switch being parallel-connected between the terminals of the first diode.

* * * * *